United States Patent
Kasai et al.

(10) Patent No.: US 8,907,259 B2
(45) Date of Patent: Dec. 9, 2014

(54) MICROWAVE IRRADIATION DEVICE AND MICROWAVE IRRADIATION METHOD

(75) Inventors: Shigeru Kasai, Nirasaki (JP); Mitsutoshi Ashida, Narasaki (JP)

(73) Assignee: Tokyo Electron Limited, Tokyo (JP)

( * ) Notice: Subject to any disclaimer, the term of this patent is extended or adjusted under 35 U.S.C. 154(b) by 559 days.

(21) Appl. No.: 13/231,546

(22) Filed: Sep. 13, 2011

(65) Prior Publication Data

US 2012/0061384 A1 Mar. 15, 2012

(30) Foreign Application Priority Data

Sep. 14, 2010 (JP) ................................ 2010-205715
Aug. 17, 2011 (JP) ................................ 2011-178378

(51) Int. Cl.
 *H05B 6/68* (2006.01)
 *H05B 6/80* (2006.01)
 *H01L 21/324* (2006.01)
 *H01L 21/67* (2006.01)

(52) U.S. Cl.
 CPC .................. *H05B 6/68* (2013.01); *H05B 6/806* (2013.01); *H01L 21/324* (2013.01); *H05B 2206/04* (2013.01); *H01L 21/67115* (2013.01)
 USPC ....................................................... 219/718

(58) Field of Classification Search
 USPC ......... 219/679, 680, 678, 702, 746, 761, 745, 219/750, 754, 715–717; 438/795, 758, 769
 See application file for complete search history.

(56) References Cited

U.S. PATENT DOCUMENTS

| | | | | |
|---|---|---|---|---|
| 5,083,093 A * | 1/1992 | Adler et al. | .................... | 327/304 |
| 6,903,319 B2 * | 6/2005 | Suenaga et al. | ............... | 219/715 |
| 7,884,559 B2 * | 2/2011 | Liu et al. | ........................ | 315/503 |
| 8,005,351 B2 * | 8/2011 | Camm et al. | ................... | 392/416 |
| 2004/0144776 A1 * | 7/2004 | Han et al. | ....................... | 219/716 |
| 2007/0167029 A1 * | 7/2007 | Kowalski et al. | ............. | 438/769 |
| 2007/0224839 A1 * | 9/2007 | Shimizu | ........................ | 438/795 |
| 2008/0099472 A1 * | 5/2008 | Cetinel et al. | ................. | 219/704 |
| 2009/0079353 A1 * | 3/2009 | Sakai et al. | .................... | 315/206 |
| 2009/0159880 A1 * | 6/2009 | Honda et al. | .................... | 257/43 |
| 2010/0055881 A1 * | 3/2010 | Shimizu | ........................ | 438/478 |
| 2010/0059509 A1 * | 3/2010 | Imai et al. | ..................... | 219/690 |
| 2010/0089908 A1 * | 4/2010 | Suenaga et al. | ............... | 219/702 |

FOREIGN PATENT DOCUMENTS

| | | |
|---|---|---|
| JP | 10-275567 | 10/1998 |
| JP | 2007-213814 | 8/2007 |
| JP | 2009-516375 | 4/2009 |

* cited by examiner

*Primary Examiner* — Dana Ross
*Assistant Examiner* — Renee L Miller
(74) *Attorney, Agent, or Firm* — Oblon, Spivak, McClelland, Maier & Neustadt, L.L.P.

(57) ABSTRACT

A microwave irradiation device includes a chamber for accommodating an object to be processed; a plurality of magnetrons for generating microwaves and irradiating the microwaves to the object to be processed in the chamber; and a power supply unit for supplying a pulse-shaped voltage to each magnetron. The power supply unit supplies the pulse-shaped voltage to the magnetrons while preventing temporal overlap of voltage pulses of the pulse-shaped voltage supplied to the respective magnetrons with each other.

14 Claims, 13 Drawing Sheets

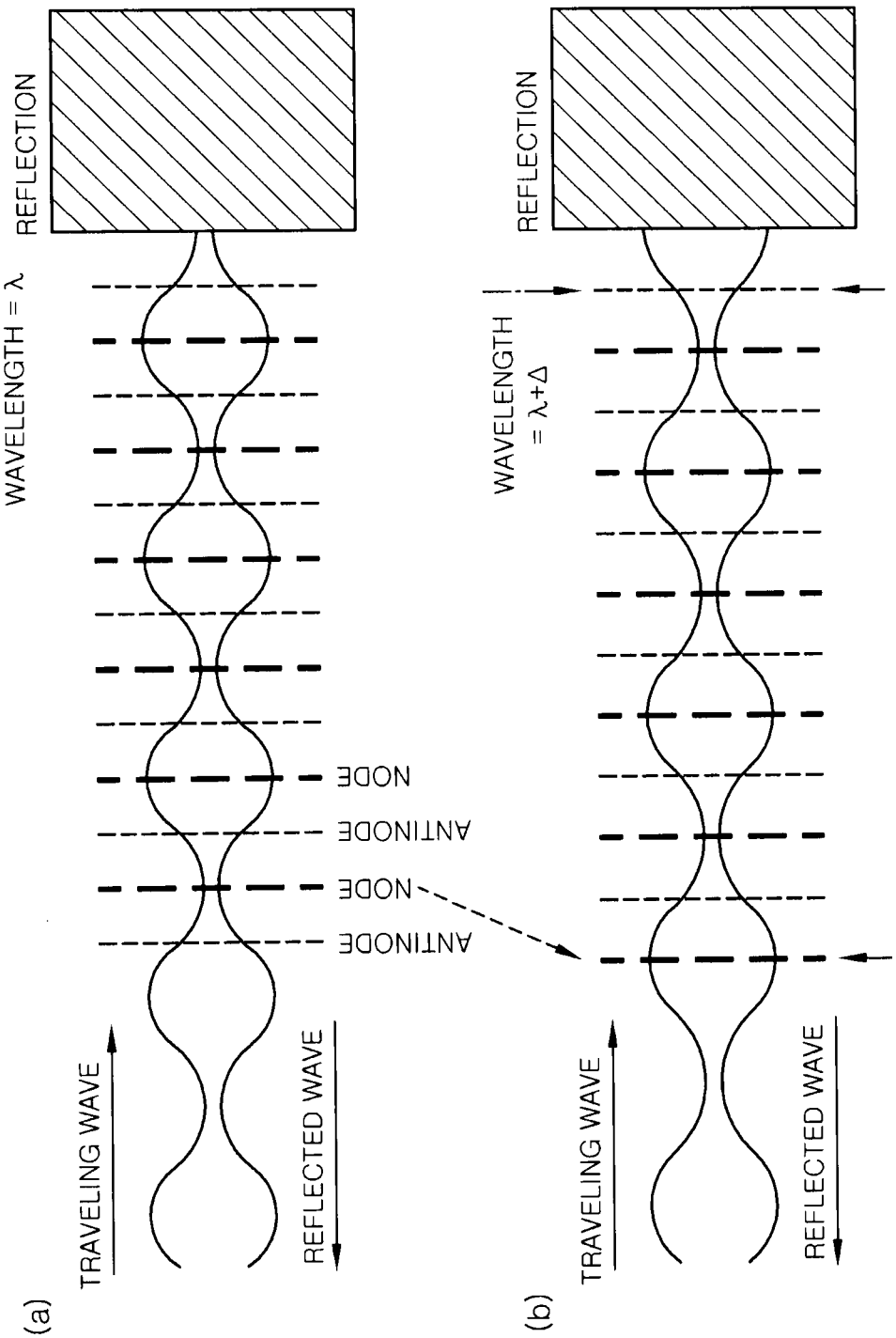

MICROWAVE IRRADIATION DEVICE AND MICROWAVE IRRADIATION METHOD

FIELD OF THE INVENTION

The present invention relates to a microwave irradiation device and a microwave irradiation method for performing processes such as heating and the like by irradiating microwaves to an object.

BACKGROUND OF THE INVENTION

In a semiconductor device manufacturing process, an annealing process is performed to activate a dopant or the like. As for this annealing process, a microwave annealing process is proposed (e.g., Japanese Patent Application Publication No. 2009-516375). The microwave annealing process attracts attention as a next-generation annealing process, because it suppresses diffusion of impurities and allows formation of a thin activation layer. Further, it is reported that a loss of lattices can be recovered when the annealing is performed by microwaves.

A microwave generating unit is generally provided with a magnetron. When a wafer having a diameter of about 300 mm is used as an object to be annealed, a single magnetron cannot provide sufficient power and, thus, a plurality of magnetrons is required. However, when microwaves from a plurality of magnetrons are combined by irradiating them simultaneously, the electromagnetic waves (microwaves) from the magnetrons interfere with each other, contrary to the case of being combined in a plasma state, and the amount of reflection waves is increased. Accordingly, it is difficult to effectively supply a power.

SUMMARY OF THE INVENTION

In view of the above, the present invention provides a microwave irradiation device and a microwave irradiation method, capable of irradiating microwaves by using a plurality of magnetrons while decreasing a reflected power.

In accordance with one aspect of the present invention, there is provided a microwave irradiation device includes a chamber for accommodating an object to be processed; a plurality of magnetrons for generating microwaves and irradiating the microwaves to the object to be processed in the chamber; and a power supply unit for supplying a pulse-shaped voltage to each magnetron. The power supply unit supplies the pulse-shaped voltage to the magnetrons while preventing temporal overlap of voltage pulses of the pulse-shaped voltage supplied to the respective magnetrons with each other.

In accordance with another aspect of the present invention, there is provided a microwave irradiation method for irradiating microwaves, generated by supplying a pulse-shaped voltage to a plurality of magnetrons to an object to be processed in a chamber, the microwave irradiation method includes supplying the pulse-shaped voltage to the magnetrons while preventing temporal overlap of voltage pulses of the pulse-shaped voltage supplied to the respective magnetrons with each other.

In accordance with the present invention, a pulse-shaped voltage is supplied while preventing the temporal overlap of the pulses of the pulse-shaped voltage supplied to a plurality of magnetrons, so that there is no instance at which the microwaves are simultaneously generated from the magnetrons. Since the interference of the microwaves generated from the magnetrons is prevented, the generation of the reflection waves can be inhibited, and the microwaves can be effectively supplied from the magnetrons to the object to be processed. By preventing the simultaneous generation of the microwaves from the magnetrons, the phases of the microwaves do not interfere with each other. Further, compared to the case of simultaneously generating the microwaves, the electric field intensity can be increased, and the uniformity of the electric field intensity is considerably improved.

BRIEF DESCRIPTION OF THE DRAWINGS

The objects and features of the present invention will become apparent from the following description of embodiments, given in conjunction with the accompanying drawings, in which:

FIG. 7 shows relationship between a frequency shift and a movement amount of a position of a standing wave;

DETAILED DESCRIPTION OF THE EMBODIMENTS

The embodiment of the present invention will be described with reference to the accompanying drawings which form a part hereof. Hereinafter, an example in which the present invention is applied to an apparatus for performing annealing by irradiating microwaves to a semiconductor wafer as an object to be processed will be described. However, the object to be processed is not limited to a semiconductor wafer, and the microwave irradiation treatment is not limited to annealing.

Figure 1:
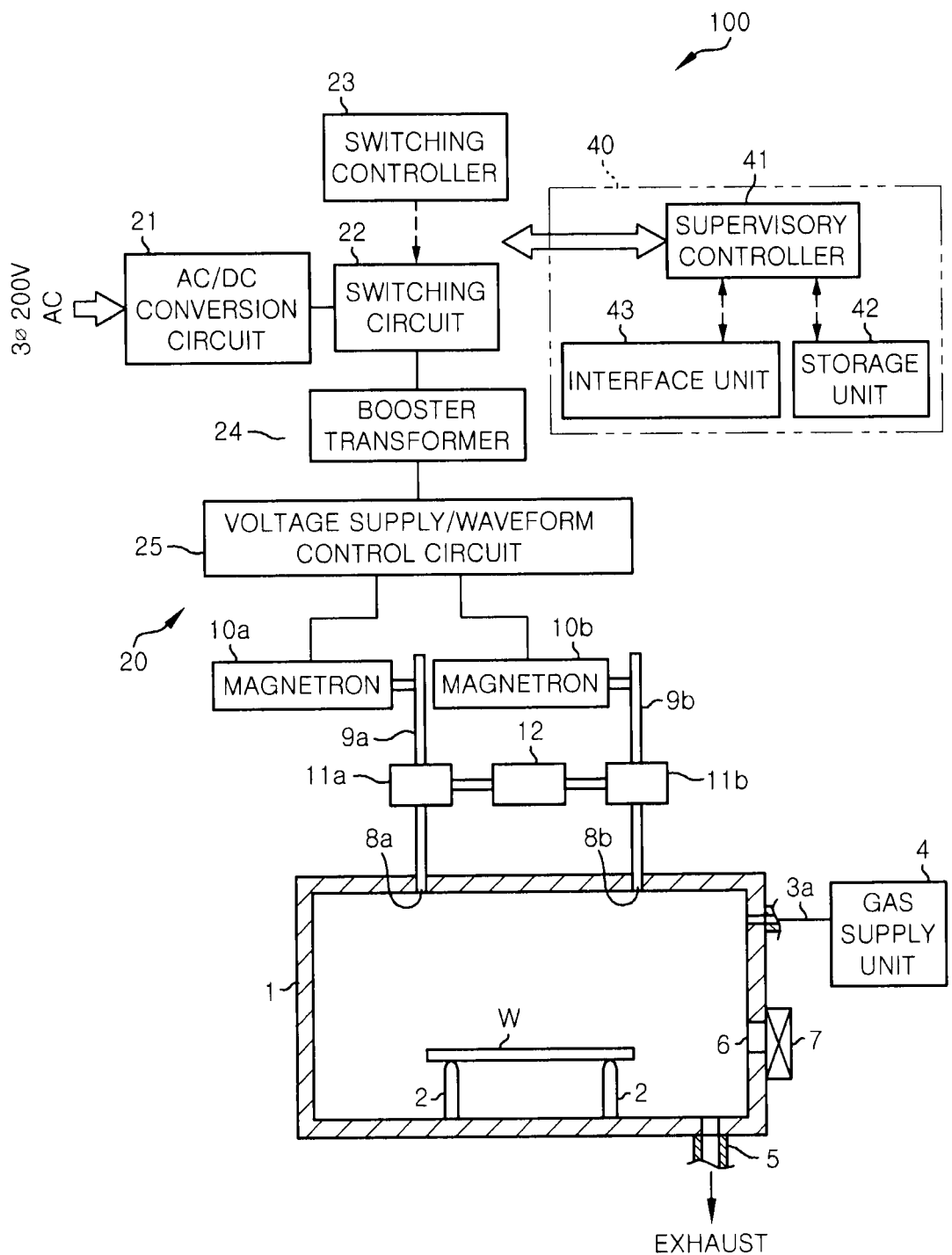
FIG. 1 is a schematic diagram showing a microwave irradiation device in accordance with a first embodiment of the present invention.

FIG. 1 is a schematic diagram showing a microwave irradiation device in accordance with a first embodiment of the present invention. This microwave irradiation device 100 includes a chamber 1 for accommodating a semiconductor wafer W as an object to be processed. In the chamber 1, a plurality of, e.g., three (only two are shown), mounting pins 2 for mounting thereon the semiconductor wafer W is provided so as to protrude from the bottom portion of the chamber 1. The mounting pins 2 are made of a material having a low dielectric loss, such as quartz or the like. A gas inlet port 3 is formed at an upper portion of a sidewall of the chamber 1, so that a gas forming an atmosphere for treatment can be supplied from a gas supply unit 4 into the chamber 1 via a line 3a. As for such atmosphere forming gas, it is possible to use a nonreactive gas such as an Ar gas, an $N_2$ gas or the like. Depending on processes, an atmosphere forming gas may be an $H_2$ gas, an $O_2$ gas or the like. A gas exhaust port 5 for exhausting a gas is provided at a bottom portion of the chamber 1, and a loading/unloading port 6 for loading and unloading a semiconductor wafer W is provided on a sidewall so as to be openable and closable by a gate 7. Moreover, a pressure in the chamber 1 is maintained at a predetermined pressure close to an atmospheric pressure.

Two microwave inlet ports 8a and 8b are provided at an upper portion of the chamber 1, and are connected to magnetrons 10a and 10b for generating microwaves via waveguides 9a and 9b, respectively. Circulators 11a and 11b are connected in the waveguides 9a and 9b between the magnetrons 10a and 10b and the chamber 1, and a common dummy load 12 is connected to the circulators 11a and 11b. The circulators 11a and 11b and the dummy load 12 form an isolator for separating reflected microwaves. In other words, the microwaves reflected in the chamber 1 are transmitted to the dummy load 12 by the circulators 11a and 11b, and then are converted into heat at the dummy load 12.

A high-voltage power supply unit 20 supplies powers to the magnetrons 10a and 10b. The high-voltage power supply unit 20 includes: an AC/DC conversion circuit 21 for rectifying a three-phase 200 V AC supplied from a commercial power supply and then converting it to a DC voltage having a predetermined waveform; a switching circuit 22 for performing DC switching; a switching controller 23 for controlling the switching circuit 22; a booster transformer 24 for boosting a voltage to a desired value; and a voltage supply/waveform control circuit 25, connected to a secondary side of the booster transformer 24, for applying the voltage at the secondary side to each of the magnetrons 10a and 10b while controlling the voltage to a predetermined waveform by half-wave rectification.

Figure 2:
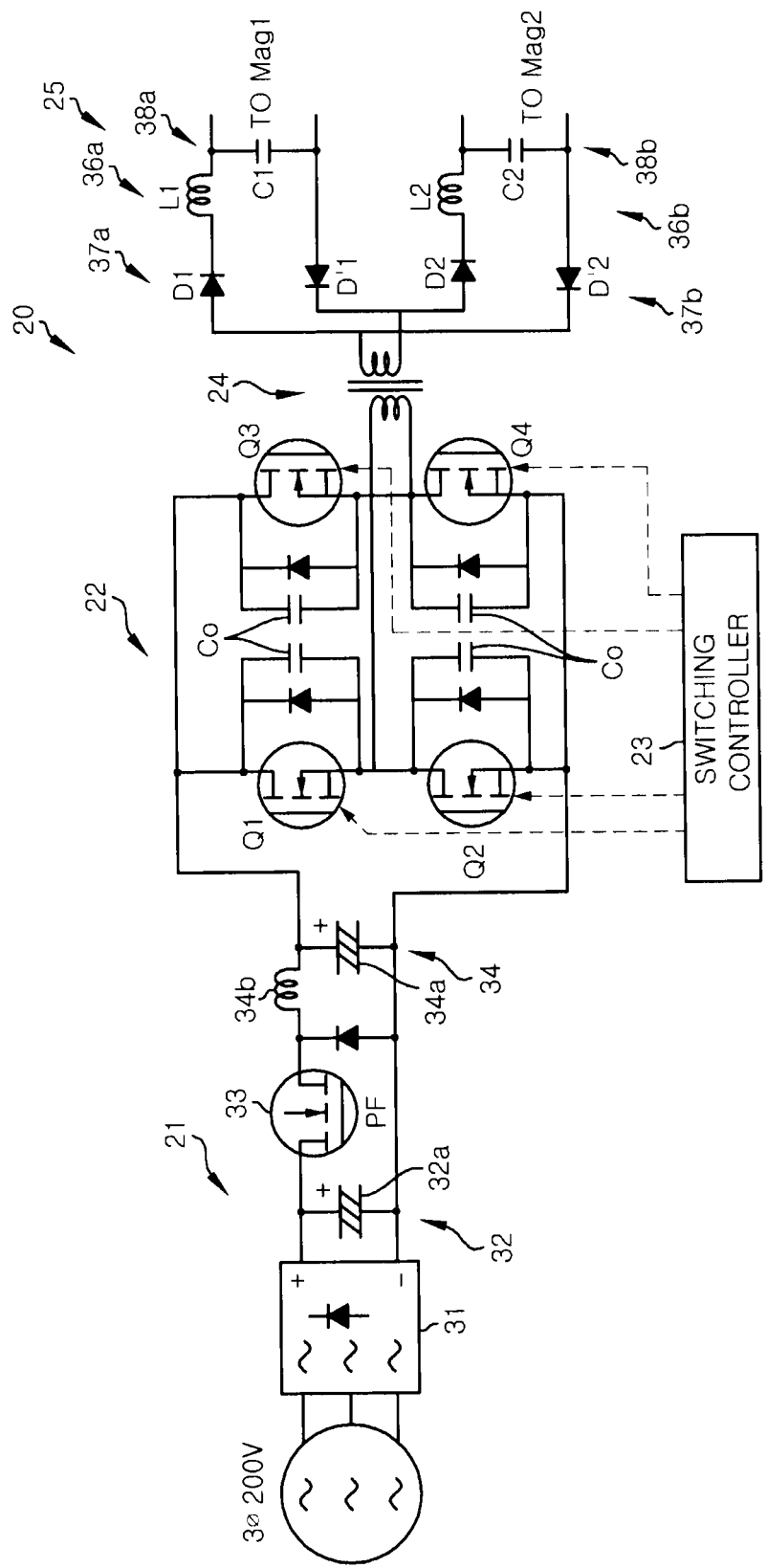
FIG. 2 is a circuit diagram showing principal parts of the microwave irradiation device.

FIG. 2 is a circuit diagram of the power supply unit 20. As shown in FIG. 2, the AC/DC conversion circuit 21 includes a rectifier circuit 31, a smoothing circuit 32 having a capacitor 32a, a power FET 33 for improving a power factor, and a smoothing circuit 34 having a capacitor 34a and a coil 34b. The switching circuit 22 is configured as a full bridge circuit (referred to as an "H-bridge") having four switching transistors Q1 to Q4, and is to generate a pulse-shaped voltage by performing phase-shift type PWM (Pulse Width Modulation) control or PAM (Pulse Amplitude Modulation) control by the switching controller 23. Gate drive signals are inputted from the switching controller 23 to the switching transistors Q1 to Q4, and then outputs from the switching transistors Q1 to Q4 are combined to be outputted from the switching circuit 22 as a pulse-shaped trans primary voltage. In the case of the phase-shift type PWM control, phase-controlled gate drive signals having a duty ratio of about 50% are inputted from the switching controller 23 to the switching transistors Q1 to Q4 to be combined.

Figure 3:
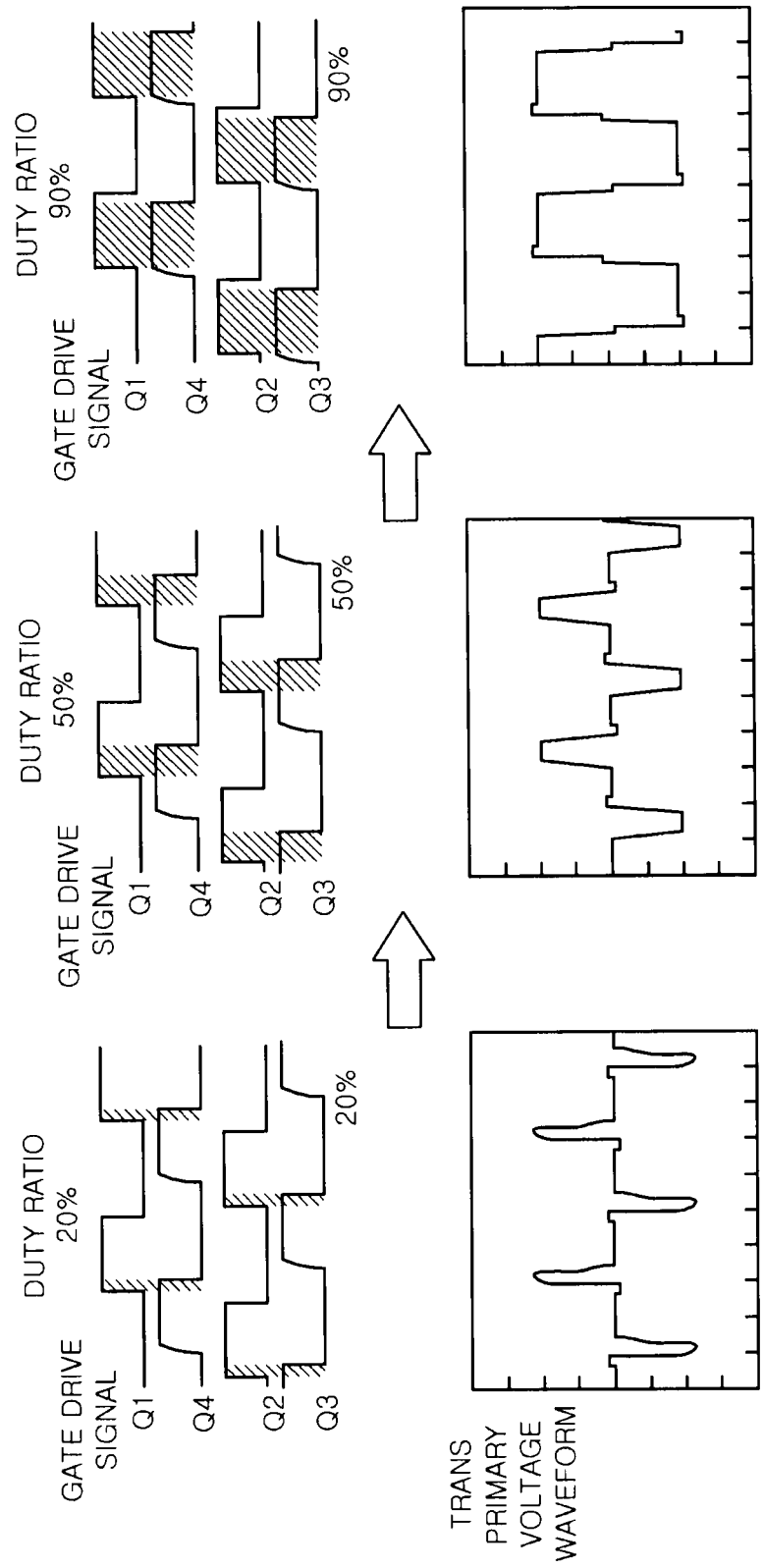
FIG. 3 shows states of phase shift for obtaining pulse-shaped trans primary voltages having duty ratios of about 20%, 50% and 90% and voltage waveforms obtained at that time.

Accordingly, a pulse-shaped voltage is outputted as a trans primary voltage from the switching circuit 22. Among the switching transistors Q1 to Q4, the transistors Q1 and Q4 are positive output transistors, and the transistors Q2 and Q3 are negative output transistors. By phase-shifting the switching transistors Q1 to Q4, a pulse voltage having a desired duty ratio can be outputted as a trans primary voltage. FIG. 3 shows states of phase shift for obtaining pulse-shaped trans primary voltages having duty ratios of about 20%, 50% and 90% in the case of changing the duty ratio of the trans primary voltage by phase-shifting the switching transistors Q1 to Q4 and voltage waveforms obtained at that time. In FIG. 3, the time at which the switching transistors Q1 and Q4 are simultaneously ON and the time at which the switching transistors Q2 and Q3 are simultaneously ON are indicated by shaded portions.

In view of the efficiency, a field effect transistor can be used as the switching transistor. Preferably, a MOS type is used. Thus, MOSFET is suitable for the switching transistor. In addition, an IGBT (insulation gate type bipolar transistor) suitable for high power and high voltage compared to the MOSFET transistor may also be used. Further, the booster transformer 24 as a load of the switching circuit 22 is connected to a wiring extending from a portion between the transistors Q1 and Q2 connected in series and a wiring extending from a portion between the transistors Q3 and Q4 connected in series. Resonant capacitors Co are inserted in parallel with the switching transistors Q1 to Q4, respectively.

The voltage supply/waveform control circuit 25 includes a first voltage supply unit 36a for supplying a voltage to the magnetron 10a, and a second voltage supply unit 36b for supplying a voltage to the magnetron 10b. The first and the second voltage supply unit 36a and 36b are connected to a secondary side of the booster transformer 24. The first voltage supply unit 36a has a first rectifying circuit 37a having two diodes D1 and D'1 for rectifying a pulse-shaped voltage from the switching circuit 22, and a first smoothing circuit 38a having a coil L1 and a capacitor C1. The second voltage supply unit 36b has a second rectifying circuit 37b having two diodes D2 and D'2 for rectifying the pulse-shaped voltage from the switching circuit 22, and a second smoothing circuit 38b having a coil L2 and a capacitor C2. In the smoothing circuits 38a and 38b, a filter is configured such that it passes a frequency of a power pulse waveform without passing a switching frequency by controlling time constants of the coils L1, L2 and the capacitors C1 and C2. The coils L1 and L2 and the capacitors C1 and C2 can be omitted when the booster transformer 24 is made of a material that does not pass a high frequency, such as a silicon steel plate.

Figure 4A:
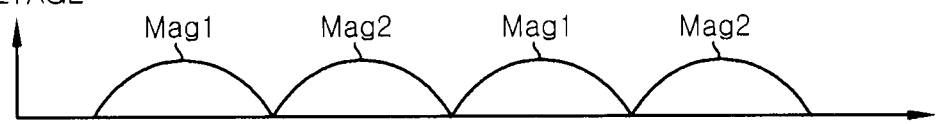
FIGS. 4A and 4B show desirable examples of a waveform of a voltage supplied to two magnetrons in the microwave irradiation device of FIG. 1.
Figure 4B:
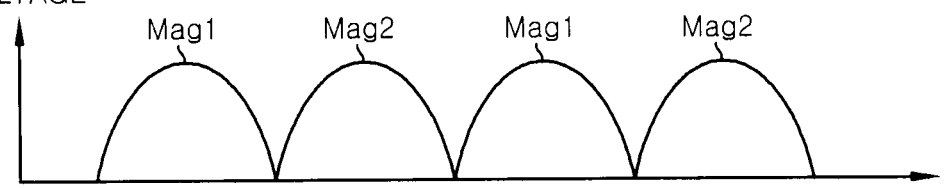

With this configuration, the first and the second voltage unit 36a and 36b can generate a half-wave rectified waveform of about 50 Hz at a switching frequency of, e.g., about 100 kHz, and a pulse-shaped voltage having such waveform can be supplied to the magnetrons 10a (Mag1) and 10b (Mag2). The voltage supplied to the magnetron 10a (Mag1) is on-off controlled by the switching transistors Q1 and Q4 of the switching circuit 22, and the voltage supplied to the magnetron 10b (Mag2) is on/off controlled by the switching transistors Q2 to Q3. Hence, in the voltage supply/waveform control circuit 25, the voltage is controlled such that the voltage pulse of the first voltage supply unit 36a and that of the second voltage supply unit 36b do not overlap with each other over time. Specifically, as shown in FIGS. 4A and 4B, the voltage pulse supplied from the first voltage supply unit 36a to the magnetron 10a (Mag1) and the voltage pulse supplied from the second voltage supply unit 36b to the magnetron 10b (Mag2) are alternately applied, and a full-wave rectified waveform having a pseudo sine curve of about 50 Hz is generated with a switching frequency of, e.g., about 100 kHz. Accordingly, there is no instance at which the microwaves are simultaneously generated from the magnetrons 10a (Mag1) and 10b (Mag2).

Figure 5:
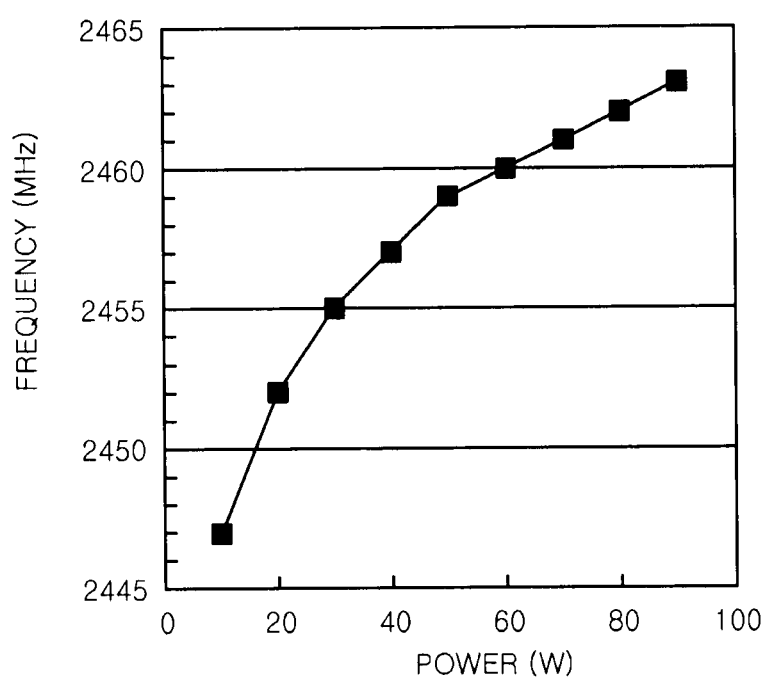
FIG. 5 is a graph showing relationship between a microwave power outputted from a magnetron of 2.45 GHz and an output frequency thereof.

The microwaves irradiated from the magnetrons 10a and 10b interfere with each other and produce standing waves. In order to reduce the effect of the standing waves, a cathode-anode current to the magnetrons is controlled. FIG. 5 is a graph showing relationship between a power of a microwave outputted from a magnetron of 2.45 GHz and a center frequency of the outputted microwave. As can be seen from FIG. 5, the center frequency is increased as the output power is increased. The power of the microwave outputted from the magnetron is in direct proportion to a current value of the high-voltage power supply unit 20 (DC power supply), so that the center frequency as well as the power can be shifted by changing the current value. As can be seen from FIG. 5, when the power is increased from about 0 W to about 100 W by changing the current value, the center frequency is shifted by about 20 MHz. When the voltage supplied from the high-voltage power supply 20 to the magnetron of 2.45 GHz is a pure DC voltage or has a rectangular pulse waveform, a bandwidth of a center frequency is fixed to about 10 MHz and, hence, the effect of the standing waves is large. On the other hand, when the voltage has a half-wave rectified waveform of FIGS. 4A and 4B, the current as well as the voltage has a pseudo sine waveform. The current is continuously changed between 0 and a predetermined value, so that the center frequency of the microwaves can be shifted. When the current becomes maximum corresponding to the power of about 100 W, the center frequency is shifted by about 20 MHz, as can be seen from FIG. 5. In the case of the magnetron of about 2.45 GHz, the wavelength of the output microwave is about 120 mm. Therefore, a length between nodes of a standing wave is about 60 mm. When the bandwidth of the center frequency is about 20 MHz, distance of an antinode and a node of a standing wave can be shifted within about 0.6 mm, and thus the effect of the standing wave can be reduced. Therefore, the microwaves can be more uniformly irradiated by controlling the voltage applied from the high-voltage power supply unit 20 to the magnetron to have a pseudo sine waveform as a half-wave rectified waveform.

Figure 6:
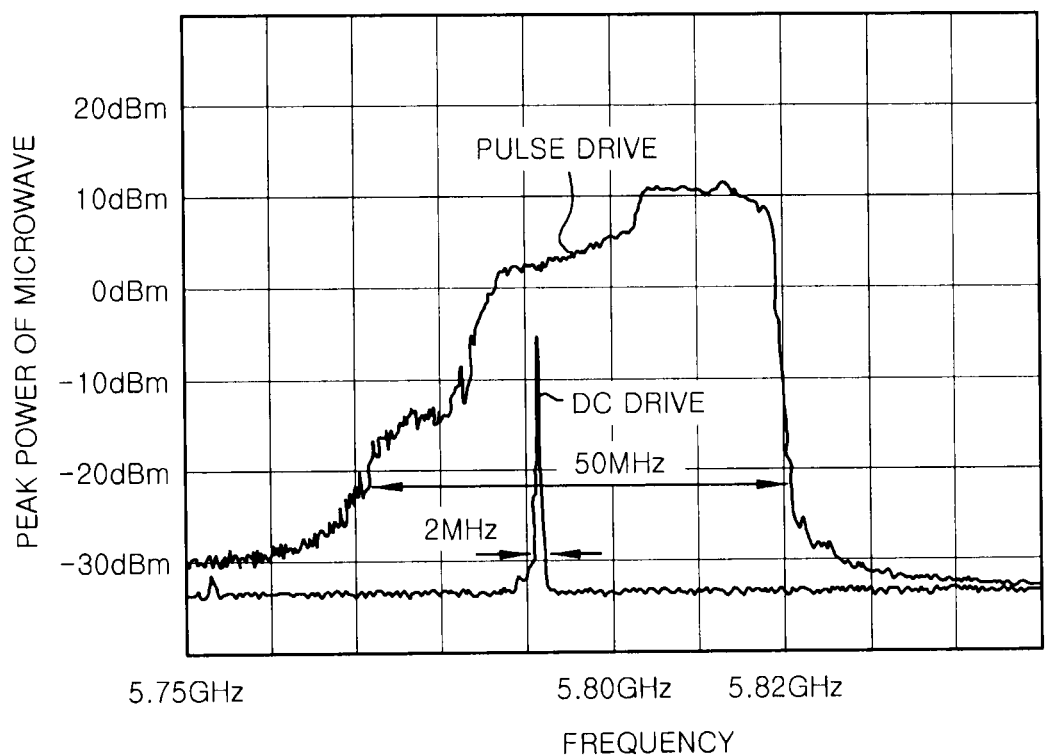
FIG. 6 is a graph showing relationship between a frequency of microwave outputted from a magnetron of 5.8 GHz and peak power of the outputted microwave.

FIG. 6 is a graph showing relationship between a frequency of microwave outputted from a magnetron of 5.8 GHz and peak power of the outputted microwave. Also in the case of the magnetron of about 5.8 GHz, as can be seen from FIG. 6, the center frequency is increased as the output power is increased. As described above, the power of the microwave outputted from the magnetron is in direct proportion to a current value of the high-voltage power supply unit 20 (DC power supply), so that the center frequency as well as the power can be shifted by changing the current value. When the power is increased from about 0 W to about 500 W by changing the current value, the center frequency is shifted by about 50 MHz as can be seen from FIG. 6. When the voltage supplied from the high-voltage power supply 20 to the magnetron of 5.8 GHz is a pure DC voltage or has a rectangular pulse waveform, a bandwidth of a center frequency is fixed to about 2 MHz and, hence, the effect of the standing waves is large.

On the other hand, when the voltage has a half-wave rectified waveform of FIGS. 4A and 4B, the current as well as the voltage has a pseudo sine waveform. The current is continuously changed between 0 and a predetermined value, so that the center frequency of the microwaves can be shifted. When the current becomes maximum corresponding to the power of about 500 W, the center frequency is shifted by about 50 MHz, as can be seen from FIG. 6.

In the case of the magnetron of 5.8 GHz, the wavelength of the output microwave is about 52 mm. Therefore, a length between nodes of a standing wave is about 26 mm. When the bandwidth of the center frequency is about 50 MHz, distance of an antinode and a node of a standing wave can be shifted within about 0.26 mm, and thus the effect of the standing wave can be reduced. Therefore, the microwaves can be more uniformly irradiated by controlling the voltage applied from the high-voltage power supply unit 20 to the magnetron of 5.8 GHz to have a pseudo sine waveform as a half-wave rectified waveform.

Hereinafter, the reason why the effect of the standing wave is suppressed within a small amount shift of about 0.26 mm will be described.

The description will be made in a case that microwaves outputted from a magnetron is reflected from a wall of the chamber and the microwaves become standing waves. If a wavelength of the standing waves is shifted from "$\lambda$" to "$\lambda+\Delta$," and the number of pulses thereof in a travelling distance of the standing waves started from a reference position (e.g., an end of a substrate to be processed) and returned back thereto after reflection from the wall is set to "n", the reflected standing waves is shifted by $n \times \Delta$ at the reference position and a phase between node and antinode of a standing wave thereat is shifted by $n \times \Delta/\lambda$.

Referring to FIG. 7A, a standing wave having a wavelength $\lambda$ is reflected from the wall of the chamber and the number of pulses in the travelling passage thereof, i.e., "n" is 10. If a wavelength of the standing wave is shifted from "$\lambda$" to "$\lambda+\Delta$", a position of the standing wave after the reflection at an input end thereof (or at an end of a substrate to be processed) is shifted by $n \times \Delta$, though a position of a node and an antinode of the standing wave near a reflected portion thereof (opposite end portion of the input end) is merely shifted by about $\Delta$ as shown in FIG. 7B.

The input end is disposed at about 260 mm away from the wall of the chamber in a case that the "n" is 10 when the standing waves are microwaves having frequency of 5.8 GHz and a wavelength of 52 mm. In this case, 1% of the frequency shift ($\Delta=0.52$ mm) can shift the position of the standing waves by about 10%, i.e., 5.2 mm, and thus the effect of the standing wave can be reduced.

Figure 8A:
FIGS. 8A to 8C show other desirable examples of the waveform of the voltage applied to the two magnetrons in the microwave irradiation device of FIG. 1.
Figure 8B:
Figure 8C:

Such effect can also be obtained, in addition to the case of the pseudo sine curve, in the case of, e.g., a triangular waveform of FIG. 8A, a trapezoidal waveform of FIG. 8B and a saw-toothed waveform of FIG. 8C. This is because the current value is continuously changed over time when the voltage value has a pulse-shaped waveform (waveform that is continuously changed over time).

Figure 9:
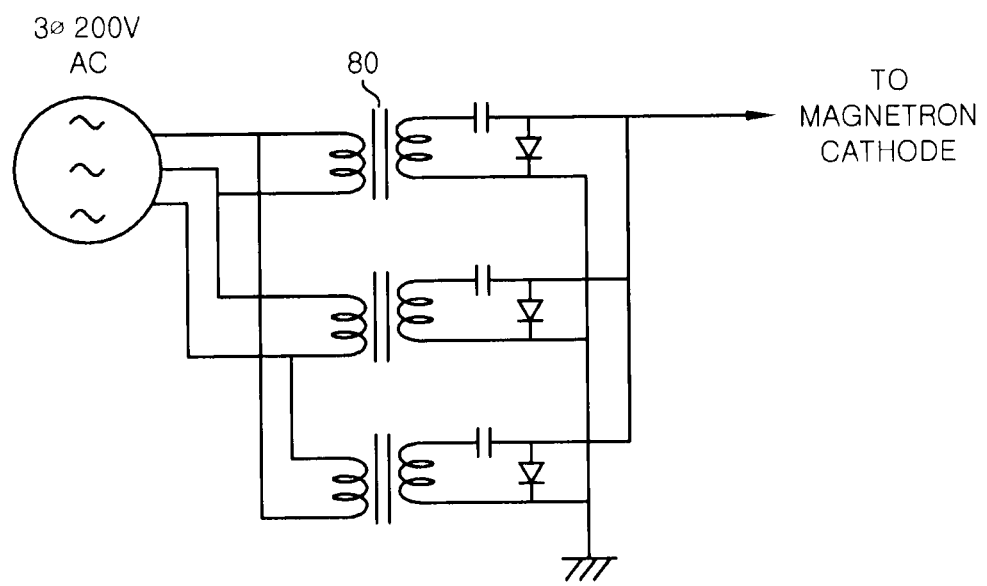
FIG. 9 is a circuit diagram showing a leakage transformer used in a microwave oven.

When a leakage transformer 80 used in a microwave oven shown in FIG. 9 serves as a booster unit, good controllability is ensured. Since, however, it is a three-phase transformer having a large power capacity, the voltage applied to the magnetron is a DC voltage or has a square waveform. This makes it difficult to reduce the effect of the standing wave. On the contrary, in the present embodiment, there is used a power circuit for rectifying a three-phase AC voltage and then performing boosting by the booster transformer 24 having a low leakage. Therefore, the voltage waveform at the primary side can also be maintained at the secondary side. Further, the effect of the standing wave can be reduced by controlling the waveform to the pseudo sine curve or the like.

As for the magnetron, a magnetron that generates microwaves of various frequencies can be used. However, in view of preventing electric discharge on the wafer as an object to be processed, it is preferable to use a magnetron that oscillates at a high frequency, preferably at 2.45 GHz or 5.8 GHz, and more preferably at 5.8 GHz.

Figure 10:
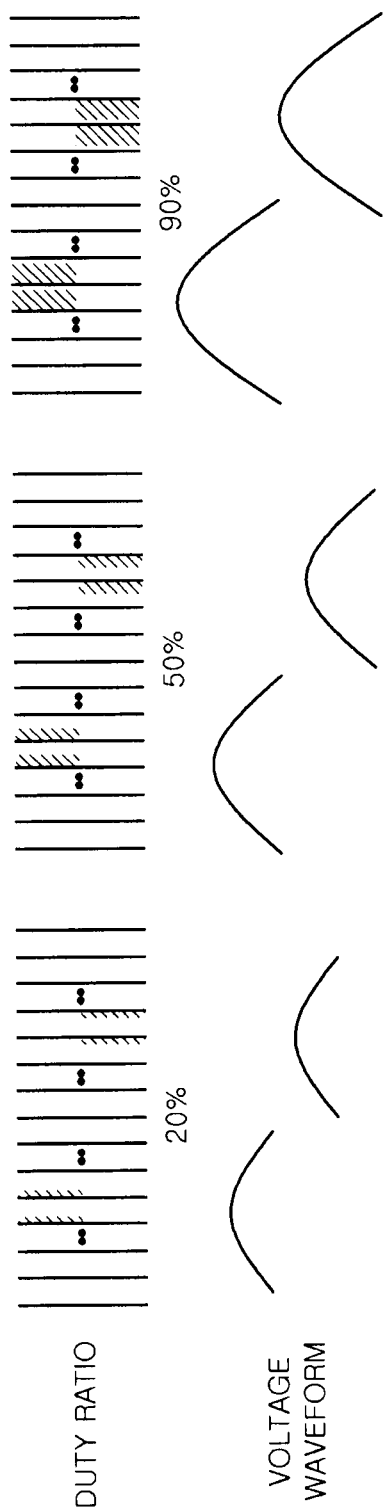
FIG. 10 shows an example in which the waveforms of the voltage supplied to the magnetrons are controlled by PWM control.

The control of the waveform of the voltage supplied to the magnetron by using the characteristics of the magnetron which has the purpose of reducing the standing waves can be realized by controlling the ON/OFF time of the switching transistors Q1 to Q4 during one cycle (PWM control). An example thereof is shown in FIG. 10. Accordingly, various waveforms such as a pseudo sine curve, a sine curve and the like can be obtained.

The components of the microwave irradiation device 100 are controlled by an overall control unit 40. The overall control unit 40 includes a supervisory controller 41, a storage unit 42 for storing control programs, i.e., recipes, for performing a predetermined process and the like, the recipes having various programs required for control and processing conditions, and an interface unit 43 having a setting unit for performing various setting operations and a display unit for displaying status, alarm or the like. The recipes may be stored in a readable storage medium, e.g., a CD-ROM, a hard disc, a flexible disc, a nonvolatile memory or the like.

Hereinafter, the operation of the microwave irradiation device 100 configured as described above will be explained.

First of all, various setting operations are performed in the setting unit of the interface unit 43. Moreover, a semiconductor wafer W as an object to be processed is loaded into the chamber 1 through the loading/unloading port 6. The chamber 1 is exhausted through the gas exhaust port 5, and a predetermined amount of atmosphere gas is introduced into the chamber 1 from the gas supply unit 4 via the gas inlet port 3 such that the chamber 1 is set to be maintained under a predetermined atmosphere having a pressure close to an atmospheric pressure.

In this state, microwaves are generated by applying voltages from the high-voltage power supply unit 20 to the two magnetrons 10*a* and 10*b*. The wafer W is annealed by irradiating the microwaves generated from the magnetrons 10*a* and 10*b* to the wafer W in the chamber 1 and combining the microwave powers from the two magnetrons 10*a* and 10*b*.

At this time, if the microwaves are simultaneously generated from the two magnetrons 10*a* and 10*b*, the generated electromagnetic waves (microwaves) interfere with each other, and the amount of the reflection waves is increased. Hence, it is difficult to effectively supply the power.

In the present embodiment, when the microwaves are generated by applying voltages from the high-voltage power supply unit 20 to the two magnetrons 10*a* and 10*b*, the voltages are supplied to the two magnetrons 10*a* and 10*b* such that the pulses of the voltages applied to the two magnetrons do not overlap with each other over time. Therefore, the microwaves generated from the two magnetrons 10*a* and 10*b* are irradiated to the wafer W without temporal overlap.

Specifically, as described above, a three-phase 200 V DC voltage from a commercial power supply is supplied to the AC/DC conversion circuit 21 and then is rectified to a DC voltage having a predetermined waveform. In the switching circuit 22, the voltage is converted to, e.g., a pulse voltage shown in FIG. 3, based on the signal from the switching controller 23 and then is outputted as a trans primary voltage. The trans primary voltage is boosted by the booster transformer 24. In the first and the second voltage supply unit 36*a* and 36*b* of the voltage supply/waveform control circuit 25, a half-wave rectified waveform of about 50 Hz is generated at a switching frequency of about 100 Hz. The voltage pulse of the first voltage supply unit 36*a* and that of the second voltage supply unit 36*b* are supplied to the magnetrons 10*a* (Mag1) and 10*b* (Mag2), respectively, without temporal overlap. At this time, the pulse voltage supplied from the first voltage supply unit 36*a* to the magnetron 10*a* (Mag1) and the pulse voltage supplied from the second voltage supply unit 36*b* to the magnetron 10*b* (Mag2) are alternately applied as shown in FIGS. 4A and 4B. For example, a full-wave rectified waveform having a pseudo sine curve of about 50 Hz is generated at a switching frequency of about 100 kHz.

Therefore, there is no instance at which the microwaves are simultaneously produced from the magnetrons 10*a* (Mag1) and 10*b* (Mag2), and the microwaves generated from the magnetrons do not interfere with each other. Accordingly, the generation of the reflection waves is inhibited, and the microwave power can be effectively supplied from the two magnetrons to the wafer W.

Due to the full-wave rectified waveform of FIG. 4, the power is continuously supplied to any one of the magnetrons, which is effective. In the present embodiment, the voltage waveform is controlled to be of, e.g., a pseudo sine curve, by the high-voltage power supply unit 20, as described above. Accordingly, the frequency of the microwaves outputted from the magnetron can be shifted, and the microwaves can be uniformly irradiated while reducing the effect of the standing waves. This effect can be achieved even when the voltage waveform is, e.g., a triangular wave, a trapezoidal wave, a saw-toothed wave or the like.

In the case of a rectangular wave, the above effect is not obtained. However, the effect of the standing waves can be reduced by adjusting a microwave introduction position or the like.

Figure 11:
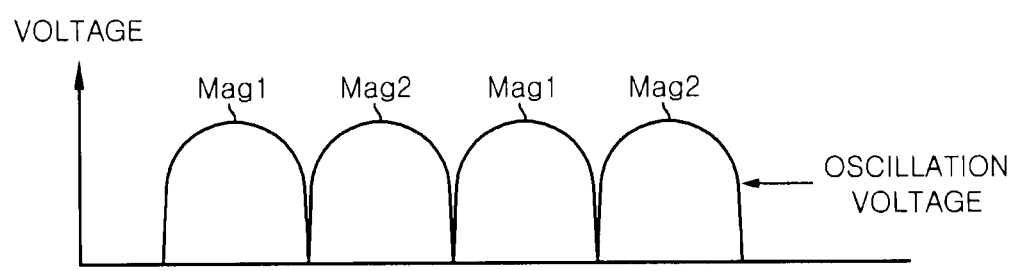
FIG. 11 shows a more desirable example of the waveform of the voltage applied to the two magnetrons in the microwave irradiation device of FIG. 1.

The magnetron does not oscillate at a low voltage and does not cause problems when a voltage is abruptly increased or decreased in a voltage range lower than an oscillation voltage. Hence, by abruptly increasing and decreasing the voltage in a voltage range lower than the oscillation voltage and controlling the voltage to have a desirable waveform, e.g., a pseudo sine curve, in a voltage range higher than the oscillation voltage as shown in FIG. 11, the time required, from the power supply to the magnetron, to oscillate the magnetron can be shortened. Accordingly, the oscillation of the magnetron can be more effectively performed.

Though above description assumes that the voltage pulses do not overlap with each other over time, overlapped voltage pulses may be included in the scope of the present invention without departing from the spirit of the present invention in a case that voltages of the overlapped voltage pulses are lower than the oscillation voltages of the magnetrons.

Figure 12:
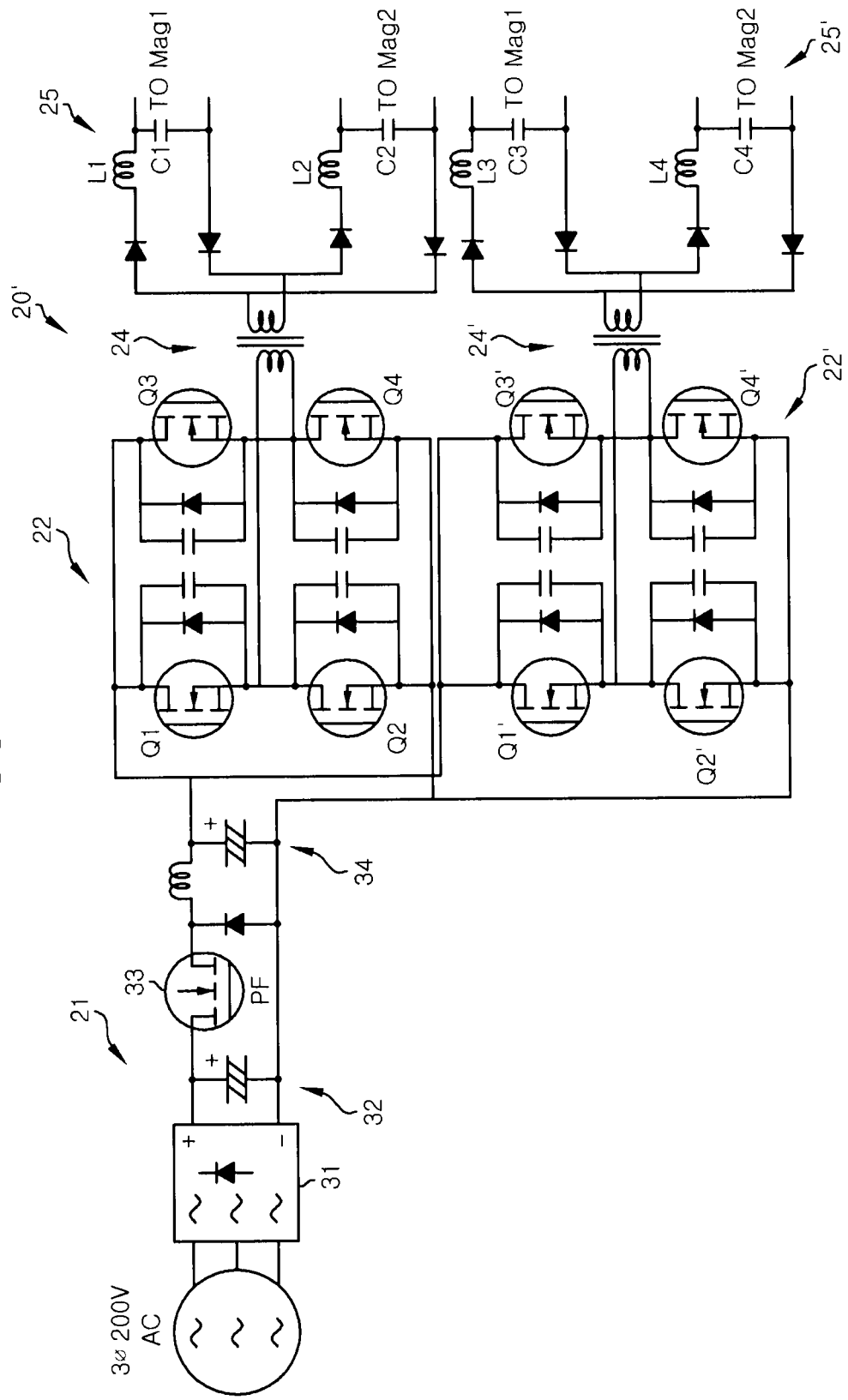
FIG. 12 is a circuit diagram showing principal parts of a microwave irradiation device in the case of providing four magnetrons.

In the above example, the microwaves are irradiated by using two magnetrons. However, the number of magnetrons can be more than two. FIG. 12 shows an example of a high-voltage power supply unit 20' in a case of irradiating the microwaves from four magnetrons. In the high-voltage power supply unit 20', a switching circuit 22' having the same configuration as that of the switching circuit 22 is connected in parallel to the AC/DC conversion circuit 21; a booster transformer 24' having the same configuration as that of the booster transformer 24 is connected to the switching circuit 22'; and a voltage supply/waveform control circuit 25' having the same configuration as that of the voltage supply/waveform control circuit 25 is connected to the booster transformer 24'. In this state, the voltage is supplied to two different magnetrons Mag3 and Mag4. Coils L3 and L4 of the waveform control circuit 25' are equivalent to the coils L1 and L2 of the waveform control circuit 25. Capacitors C3 and C4 are equivalent to the capacitors C1 and C2 of the waveform control circuit 25.

Figure 13:
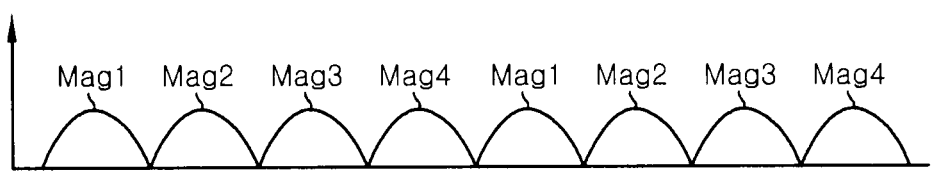
FIG. 13 shows an example of a waveform of a voltage applied to the four magnetrons in the microwave irradiation device of FIG. 12.

At this time, by phase-shifting the control signals transmitted from the switching controller 23 to the switching transistors Q1 to Q4 of the switching circuit 22 and the switching transistors Q1' to Q4' of the switching circuit 22', the voltages applied to the four magnetrons can have pulse shapes in which the voltage pulses applied to the four magnetrons do not overlap with each other over time. Specifically, the voltage supplied to the Mag1 is ON/OFF controlled by the switching transistors Q1 and Q4 of the switching circuit 22; the voltage supplied to the Mag2 is ON/OFF controlled by the switching transistors Q2 and Q3 of the switching circuit 22; the voltage supplied to the Mag3 is ON/OFF controlled by the switching transistors Q1' and Q4' of the switching circuit 22'; and the voltage supplied to the Mag4 is ON/OFF controlled by the switching transistors Q2' and Q3' of the switching circuit 22'. As a result, as shown in FIG. 13, the pulse voltages supplied to the four magnetrons Mag1 to Mag4 are sequentially applied, and a full-wave rectified waveform having pseudo sine curve of about 50 Hz which has a pseudo sine curve is generated with a switching frequency of about 100 kHz.

Therefore, there is no instance at which the microwaves are simultaneously generated from the four magnetrons Mag1 to Mag4, and the microwaves generated from the magnetrons do not interfere with each other. This inhibits the generation of reflection waves and, thus, the microwave power can be effectively supplied from the four magnetrons to the wafer W.

In accordance with the present embodiment, the voltage pulses are sequentially supplied to a plurality of magnetrons without temporal overlap. Thus, the time for supplying a voltage to each magnetron at one time is short. Generally, when a voltage is supplied to the magnetron within a short period of time, a maximum current is four times greater than a rated current. Therefore, in the present embodiment, a current higher than the rated current can be supplied, and a large power can be obtained compared to the case of continuously supplying a voltage from a single magnetron.

Hereinafter, a more desirable example of the operation of the apparatus of FIG. 12 will be described. In the switching circuit 22, when the switching transistors Q1 and Q2 are simultaneously ON or the switching transistors Q3 and Q4 are simultaneously ON, the transistors may be damaged. To that end, it is required to provide a dead time, i.e., OFF for both transistors, for safety between when the switching transistor Q1 is OFF and when the switching transistor Q2 is ON. However, this leads to the decrease of the efficiency. Hence, in this example, the voltage supplied to the Mag1 is ON/OFF controlled by the switching transistors Q1 and Q4 of the switching circuit 22; the voltage supplied to the Mag3 is ON/OFF controlled by the switching transistors Q1' and Q4' of the switching circuit 22'; the voltage supplied to the Mag2 is ON/OFF controlled by the switching transistors Q2 and Q3 of the switching circuit 22; and the voltage supplied to the Mag4 is ON/OFF controlled by the switching transistors Q2' and Q3' of the switching circuit 22'.

Figure 14:
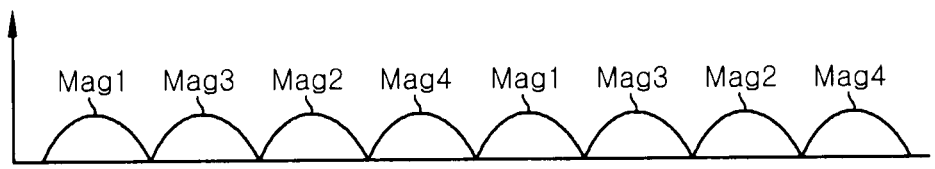
FIG. 14 is a desirable example of a supplying order of the voltage to the four magnetrons in the microwave irradiation device of FIG. 12.

As shown in FIG. 14, the pulse voltage is supplied to Mag1, Mag3, Mag2 and Mag4 in that order. As a consequence, the ON timing of the switching transistors Q1 and Q2 and that of the switching transistors Q3 and Q4 are completely separated from each other, and the breakage of the switching transistors by simultaneous ON of the switching transistors Q1 and Q2 or simultaneous ON of the switching transistors Q3 and Q4 can be prevented without providing the dead time. This is also applied to the switching transistors Q1' to Q4' of the switching circuit 22'.

In the above embodiment, the voltages are supplied to the magnetrons such that the voltage pulses of the pulse-shaped voltages are not overlapped with each other over time. Therefore, there is no instance at which the microwaves are simultaneously generated from the magnetrons, and the microwaves generated from the magnetrons do not interfere with each other. Accordingly, the generation of the reflection wave is inhibited, and the microwave power can be effectively supplied to the object to be processed. In addition to such effect, the following effect can also be obtained.

By omitting the time at which the microwaves are simultaneously generated from the magnetrons, it is possible to prevent the phase interference that occurs when the microwaves are simultaneously generated from the magnetrons. The total electric field intensity is obtained by adding absolute values of the electric field intensities of the microwaves generated from the magnetrons. Therefore, the electric field intensity can be increased compared to that obtained in the case of simultaneously generating microwaves. Further, the uniformity of the electric filed intensity is considerably improved.

Figure 15:
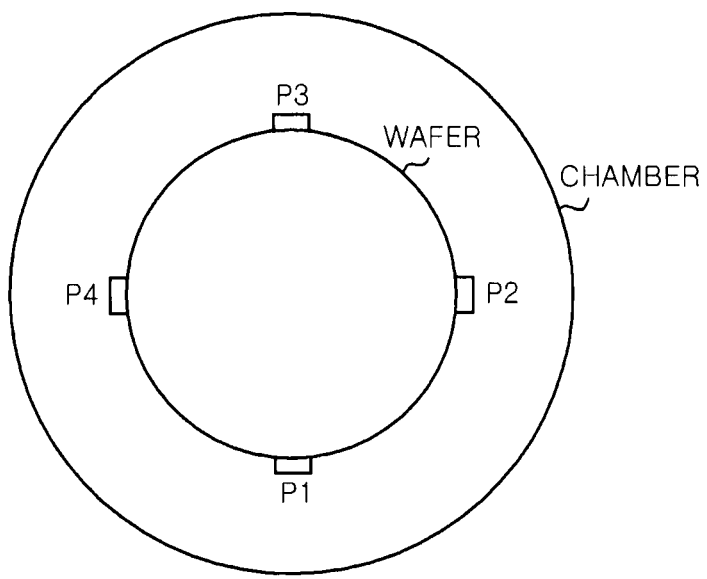
FIG. 15 shows relationship between a wafer and four inlet ports which is obtained by performing simulation on an electric field intensity of microwaves and a distribution thereof on the wafer in the case of sequentially introducing the microwaves from the four inlet ports and in the case of simultaneously introducing the microwaves from the four inlet ports.
Figure 16:
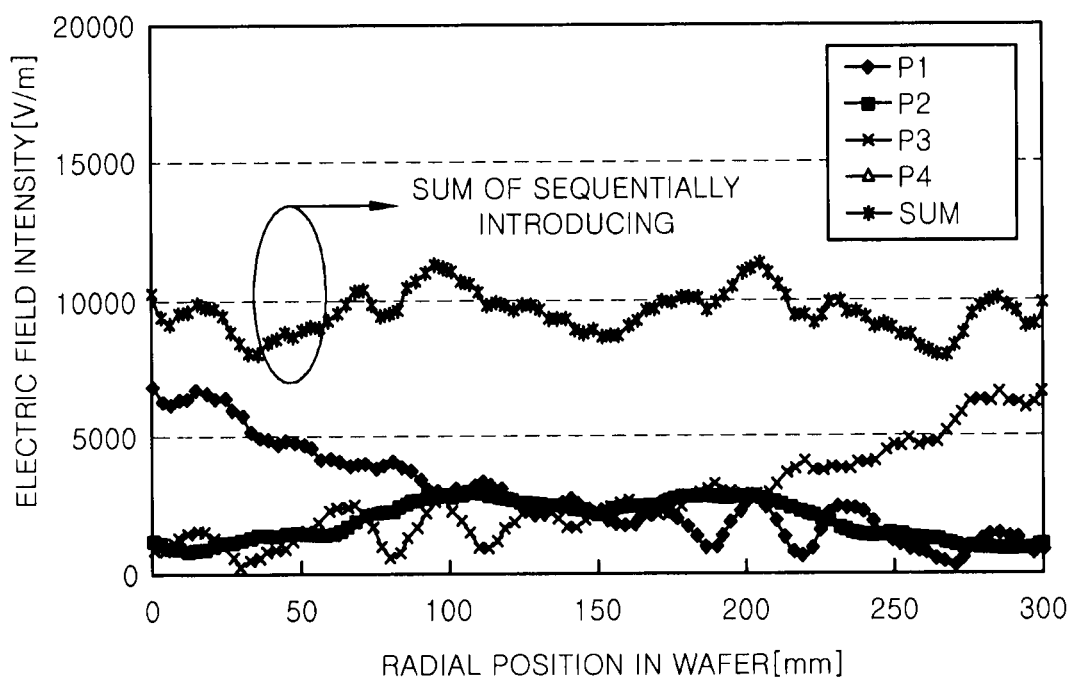
FIG. 16 shows an electric field distribution of microwaves introduced from four inlet ports on a wafer and a sum of electric field intensities of the microwaves in the case of sequentially introducing the microwaves from the four inlet ports.
Figure 17:
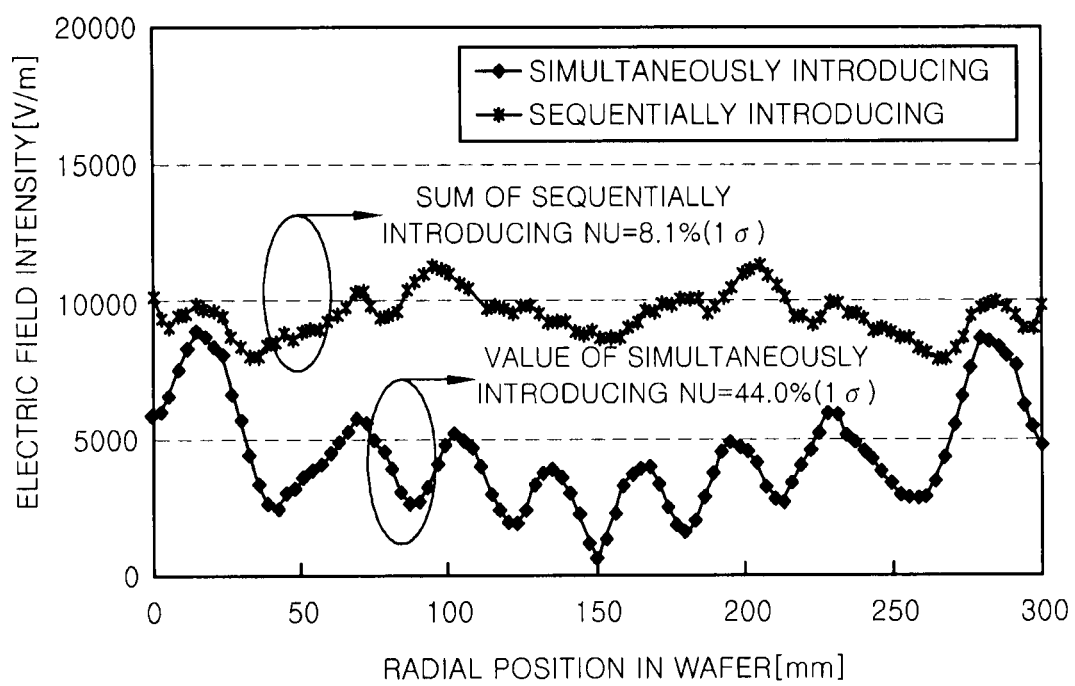
FIG. 17 shows a total electric field distribution of microwaves on a wafer in the case of sequentially introducing the microwaves from the four inlet ports and an electric field distribution of microwaves on a wafer in the case of simultaneously introducing the microwaves from the four inlet ports.

This will be described in detail hereinafter. As shown in FIG. 15, the microwaves of about 1000 W generated from the four magnetrons are introduced into the chamber from four microwave inlet ports P1 to P4 disposed at positions corresponding to a circumference of a wafer having a diameter about 300 mm at an interval of about 90°. The simulation was performed in the case of sequentially introducing the microwaves from the four inlet ports and the case of simultaneously introducing the microwaves. FIG. 16 shows the electric field distribution of the microwaves sequentially introduced from the inlet ports P1 to P4 on the wafer and a sum of the electric field intensities thereof. FIG. 17 shows the sum of electric field distribution in the case of sequentially introducing the microwaves from the four inlet ports and a sum of the electric field distribution in the case of simultaneously introducing the microwaves from the four inlet ports. Both of FIGS. 16 and 17 show the electric field distribution taken along a line that connects P1 and P3 on the wafer.

As shown in FIG. 17, when the microwaves are sequentially introduced from the four inlet ports, the electric field intensity is increased by twice at maximum compared to when the microwaves are simultaneously introduced from the four inlet ports, and the uniformity of the electric field is considerably improved.

The present invention can be variously modified without being limited to the above embodiment. For example, the above embodiment has described the case in which the microwave irradiation device of the present invention is used for annealing a semiconductor wafer. However, the semiconductor wafer is not limited to a silicon semiconductor and may also be a compound semiconductor. The object to be processed is not limited to a semiconductor wafer, and may also be a substrate for an FPD, a substrate for a solar battery, a substrate for an LED or the like. The microwave irradiation treatment is not limited to annealing, and may also be oxidation, nitriding, film formation, modification, crystallization or the like. The number of magnetrons is not limited to two or four as in the above embodiment, and may be three or more than five. Although a full-bridge circuit having four switching transistors is used as a switching circuit in the above embodiment, it is also possible to use, e.g., a half-bridge circuit. The configuration of other circuits in the above embodiment is only an example, and various circuits can be employed thereto.

While the invention has been shown and described with respect to the embodiments, it will be understood by those skilled in the art that various changes and modification may be made without departing from the scope of the invention as defined in the following claims.

What is claimed is:

1. A microwave irradiation device comprising:
    a chamber configured to accommodate an object to be processed;
    a plurality of magnetrons configured to generate and irradiate microwaves to the object to be processed in the chamber; and
    a power supply unit configured to supply voltage pulses to the magnetrons,
    wherein the power supply unit supplies the voltage pulses to the magnetrons while preventing the voltage pulses supplied to the magnetrons from temporally overlapping with each other,
    wherein the plurality of magnetrons include at least a first magnetron, a second magnetron, a third magnetron, and a fourth magnetron,
    wherein the power supply unit at least includes,
        an AC/DC conversion unit configured to convert an AC power to a DC power,
        a first and a second switching circuit to which the converted DC power is inputted, each switching circuit having a plurality of switching transistors, and the first and the second switching circuit respectively outputting a first and a second pulse-shaped voltage by combining outputs from the switching transistors,
        a switching control unit configured to control the first and the second switching circuit,
        a first voltage supply circuit configured to alternately supply voltage pulses to the first and the second magnetron based on the first pulse-shaped voltage outputted from the first switching circuit, and
        a second voltage supply circuit configured to alternately supply voltage pulses to the third and the fourth magnetron based on the second pulse-shaped voltage outputted from the second switching circuit, and
    wherein a first voltage pulse from the first voltage supply circuit is firstly supplied to the first magnetron by a part of the switching transistors of the first switching circuit; and then a second voltage pulse from the second voltage supply circuit is supplied to the third magnetron by a part of the switching transistors of the second switching circuit; and then a third voltage pulse from the first voltage supply circuit is supplied to the second magnetron by the remaining part of the switching transistors of the first switching circuit; and then a fourth voltage pulse from the second voltage supply circuit is supplied to the fourth magnetron by the remaining part of the switching transistors of the second switching circuit.

2. The microwave irradiation device of claim 1, wherein the power supply unit controls a waveform of each of the voltage pulses supplied to the first to the fourth magnetrons to continuously change over time.

3. The microwave irradiation device of claim 2, wherein the power supply unit controls the waveform of each of the voltage pulses supplied to the first to the fourth magnetrons to form a full-wave rectified waveform.

4. The microwave irradiation device of claim 2, wherein the power supply unit controls the waveform of each of the voltage pulses supplied to the first to the fourth magnetrons to form a pseudo sine curve.

5. The microwave irradiation device of claim 2, wherein the power supply unit controls the waveform to form any one of a triangular wave form, a trapezoidal wave form, and a saw-toothed wave form.

6. The microwave irradiation device of claim 2, wherein the power supply unit controls the waveform of each of the voltage pulses supplied to the first to the fourth magnetrons to have an abruptly increased portion and an abruptly decreased portion in a voltage range below an oscillation voltage of the corresponding magnetron and have a portion of a desirable waveform in a voltage range above the oscillation voltage.

7. A microwave irradiation method for irradiating microwaves by using a microwave irradiation device including a chamber configured to accommodate an object to be processed, a plurality of magnetrons configured to generate and irradiate microwaves to the object to be processed in the chamber, the plurality of magnetrons including at least a first magnetron, a second magnetron, a third magnetron and a fourth magnetron, and a power supply unit configured to supply voltage pulses to magnetrons, the power supply unit at least including 1) an AC/DC conversion unit configured to convert an AC power to a DC power, 2) a first and a second switching circuit to which the converted DC power is inputted, each switching circuit having a plurality of switching transistors, and the first and the second switching circuit respectively outputting a first and a second pulse-shaped voltage by combining outputs from the switching transistors, 3) a switching control unit configured to control the first and the second switching circuit, 4) a first voltage supply circuit configured to alternately supply voltage pulses to the first and the second magnetron based on the first pulse-shaped voltage outputted from the first switching circuit, and 5) a second voltage supply circuit configured to alternately supply voltage pulses to the third and the fourth magnetron based on the second pulse-shaped voltage outputted from the second switching circuit,
    the microwave irradiation method comprising the sequential steps of:
    supplying a first voltage pulse from the first voltage supply circuit firstly to the first magnetron by a part of the switching transistors of the first switching circuit;
    supplying a second voltage pulse from the second voltage supply circuit to the third magnetron by a part of the switching transistors of the second switching circuit;
    supplying a third voltage pulse from the first voltage supply circuit to the second magnetron by the remaining part of the switching transistors of the first switching circuit;
    supplying a fourth voltage pulse from the second voltage supply circuit to the fourth magnetron by the remaining part of the switching transistors of the second switching circuit; and wherein the power supply unit supplies the voltage pulses to the magnetrons while preventing the voltage pulses supplied to the magnetrons from temporally overlapping with each other.

8. The microwave irradiation method of claim 7, wherein a waveform of each of the voltage pulses supplied to the first to the fourth magnetrons is controlled to continuously change over time.

9. The microwave irradiation method of claim 8, wherein the waveform of each of the voltage pulses supplied to the first to the fourth magnetrons is controlled to form a full-wave rectified waveform.

10. The microwave irradiation method of claim 8, wherein the waveform of each of the voltage pulses supplied to the first to the fourth magnetrons is controlled to form a pseudo sine curve.

11. The microwave irradiation method of claim 8, wherein the waveform of each of the voltage pulses is controlled to form any one of a triangular wave form, a trapezoidal wave form, and a saw-toothed wave form.

12. The microwave irradiation method of claim 8, wherein the waveform of each of the voltage pulses supplied to the first to the fourth magnetrons is controlled to have an abruptly increased portion and an abruptly decreased portion in a voltage range below a voltage lower than an oscillation voltage of the corresponding magnetron and have a portion of a desirable waveform in a voltage range above the oscillation voltage.

13. The microwave irradiation device of claim 1, wherein at least one of the first and the second voltage supply circuits comprises a smoothing circuit having a coil and a capacitor.

14. The microwave irradiation method of claim 7, wherein at least one of the first and the second voltage supply circuits comprises a smoothing circuit having a coil and a capacitor.

* * * * *